United States Patent
Ahn et al.

(10) Patent No.: US 9,460,922 B1
(45) Date of Patent: Oct. 4, 2016

(54) LASER ANNEALING APPARATUS AND A METHOD FOR MANUFACTURING A DISPLAY APPARATUS USING THE LASER ANNEALING APPARATUS

(71) Applicant: SAMSUNG DISPLAY CO., LTD., Yongin-Si, Gyeonggi-Do (KR)

(72) Inventors: Sanghoon Ahn, Yongin-si (KR); Byoungkwon Choo, Yongin-si (KR); Byoungho Cheong, Yongin-si (KR); Jeongkyun Na, Yongin-si (KR); Seung Hwan Lee, Yongin-si (KR); Joowoan Cho, Yongin-si (KR); Hyunjin Cho, Yongin-si (KR); Oleg Prudnikov, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/937,068

(22) Filed: Nov. 10, 2015

(30) Foreign Application Priority Data

May 26, 2015 (KR) .................. 10-2015-0073090

(51) Int. Cl.
  *H01L 21/331* (2006.01)
  *H01L 21/02* (2006.01)
  *G02B 27/28* (2006.01)

(52) U.S. Cl.
  CPC ....... *H01L 21/02675* (2013.01); *G02B 27/283* (2013.01); *G02B 27/286* (2013.01)

(58) Field of Classification Search
  CPC ............. H01L 27/1285; H01L 21/268; H01L 27/1281; H01L 21/26; H01S 3/005
  See application file for complete search history.

(56) References Cited

U.S. PATENT DOCUMENTS

| 6,426,245 B1 * | 7/2002 | Kawasaki | ............... H01L 27/12 257/E27.111 |
| 6,653,179 B1 | 11/2003 | Minegishi et al. | |
| 7,630,424 B2 * | 12/2009 | Ershov | ............... G03F 7/70025 372/55 |
| 7,822,092 B2 * | 10/2010 | Ershov | ............... G03F 7/70583 372/55 |

(Continued)

FOREIGN PATENT DOCUMENTS

| JP | 62-003089 | 1/1987 |
| JP | 05-031354 | 2/1993 |

(Continued)

OTHER PUBLICATIONS

Mutsuko Hatano, et al., "Excimer Laser-Induced Temperature Field in Melting and Resolidification of Silicon Thin Films", Journal of Applied Physics vol. 87, No. 1, Jan. 1, 2000; pp. 36-43.

(Continued)

*Primary Examiner* — Jaehwan Oh
(74) *Attorney, Agent, or Firm* — F. Chau & Associates, LLC (57) ABSTRACT

A method of manufacturing a display apparatus includes forming an amorphous silicon layer on a substrate, splitting a first laser beam emitted from a first laser source into a first master beam in a first polarization state and a second master beam in a second polarization state, changing the first polarization state of the first master beam to the second polarization state to output a third master beam having the second polarization state and corresponding to the first master beam having the second polarization state, combining the second master beam with the third master beam to output a merged laser beam, and irradiating the amorphous silicon layer with the merged laser beam to form a polysilicon layer.

12 Claims, 7 Drawing Sheets

(56) References Cited

U.S. PATENT DOCUMENTS

| | | | |
|---|---|---|---|
| 7,885,309 B2* | 2/2011 | Ershov | H01S 3/225 372/57 |
| 7,999,915 B2* | 8/2011 | Ershov | G03F 7/70025 355/53 |
| 8,767,782 B2* | 7/2014 | Tanaka | B23K 26/067 219/121.6 |
| 9,058,994 B2 | 6/2015 | Kawakami | |
| 2002/0027716 A1 | 3/2002 | Tanaka | |
| 2005/0189328 A1 | 9/2005 | Tsao et al. | |
| 2005/0270650 A1* | 12/2005 | Tsukihara | B23K 26/0604 359/618 |
| 2009/0122825 A1* | 5/2009 | Ershov | G03F 7/70583 372/57 |
| 2009/0127477 A1* | 5/2009 | Tanaka | B23K 26/0738 250/492.22 |
| 2011/0121205 A1 | 5/2011 | Kim | |
| 2012/0314286 A1* | 12/2012 | Chuang | G02B 27/281 359/489.08 |
| 2013/0100333 A1* | 4/2013 | Awatsuji | G03H 1/0443 348/335 |
| 2013/0107257 A1* | 5/2013 | Goodno | H01S 3/2383 356/364 |
| 2013/0114078 A1* | 5/2013 | Honda | G01N 21/9501 356/364 |
| 2014/0016098 A1* | 1/2014 | Matsumoto | G03B 21/204 353/20 |
| 2014/0213071 A1* | 7/2014 | Kawakami | B23K 26/0613 438/798 |
| 2015/0318951 A1* | 11/2015 | Zhang | G02B 27/28 398/65 |
| 2016/0131920 A1* | 5/2016 | Cook | G02B 27/286 359/489.07 |

FOREIGN PATENT DOCUMENTS

| | | |
|---|---|---|
| JP | 06-291038 | 10/1994 |
| KR | 10-2011-0056918 | 5/2011 |

OTHER PUBLICATIONS

Zhou Guosheng, et al., "Growth of Spontaneous Periodic Surface Structures on Solids During Laser Illumination", Physical Review B, vol. 26, No. 10, Nov. 15, 1982, pp. 5366-5282.

* cited by examiner

FIG. 7

LASER ANNEALING APPARATUS AND A METHOD FOR MANUFACTURING A DISPLAY APPARATUS USING THE LASER ANNEALING APPARATUS

CROSS-REFERENCE TO RELATED APPLICATION

This application claims priority under 35 U.S.C. §119 to Korean Patent Application No. 10-2015-0073090, filed on May 26, 2015, in the Korean Intellectual Property Office, the disclosure of which is incorporated by reference herein in its entirety.

TECHNICAL FIELD

The present inventive concept relates to an apparatus of manufacturing a display apparatus, and more particularly, to a laser annealing apparatus and a method of manufacturing the display apparatus using the laser annealing apparatus.

DISCUSSION OF THE RELATED ART

An organic light-emitting display (OLED) apparatus, a liquid crystal display (LCD) apparatus, or the like, controls emission or a degree of emission of pixels by using a thin film transistor (TFT). The TFT includes a semiconductor layer, a gate electrode, source/drain electrodes, and the like, and polysilicon crystallized from amorphous silicon is used to form the semiconductor layer. Amorphous silicon may be irradiated with a laser beam to be crystallized into the polysilicon.

While quality of polysilicon crystallized from the amorphous silicon may be increased by increasing the number of times the amorphous silicon is irradiated by the laser beam, its manufacturing time may also be increased by this process.

SUMMARY

According to an exemplary embodiment of the present inventive concept, a laser annealing apparatus is provided. The apparatus includes a first laser source, a first beam splitter, a first polarization controller, and a beam combiner. The first laser source emits a first laser beam. The first beam splitter splits the first laser beam emitted from the first laser source into a first master beam in a first polarization state and a second master beam in a second polarization state. The first polarization controller outputs a third master beam having the second polarization state and corresponding to the first master beam by changing the first polarization state of the first master beam to the second polarization state. The beam combiner combines the second master beam and the third master beam with each other.

The first beam splitter may include a polarization beam splitter.

The first polarization controller may include a half-wave plate.

The laser annealing apparatus may further include a second laser source, a second beam splitter, and a second polarization controller. The second laser source emits a second laser beam. The second beam splitter splits the second laser beam emitted from the second laser source into a first slave beam in the first polarization state and a second slave beam in the second polarization state. The second polarization controller outputs a third slave beam having the second polarization state and corresponding to the first slave beam by changing the first polarization state of the first slave beam to the second polarization state. The beam combiner combines the second master beam, the third master beam, the second slave beam, and the third slave beam with each other.

Each of the first beam splitter and the second beam splitter may include a polarization beam splitter.

According to an exemplary embodiment of the present inventive concept, a laser annealing apparatus is provided. The laser annealing apparatus includes a first laser source, a first beam splitter, a first polarization controller, a second polarization controller, and a beam combiner. The first laser source emits a first laser beam. The first beam splitter splits the first laser beam emitted from the first laser source into a first master beam in a first polarization state and a second master beam in a second polarization state. The first polarization controller outputs a third master beam having a third polarization state and corresponding to the first master beam by changing the first polarization state of the first master beam to the third polarization state. The second polarization controller outputs a fourth master beam having the third polarization state and corresponding to the second master beam by changing the second polarization state of the second master beam to the third polarization state. The beam combiner combines the third master beam and the fourth master beam with each other.

The first beam splitter may include a polarization beam splitter.

Each of the first polarization controller and the second polarization controller may include a half-wave plate, and a fast axis of the first polarization controller and a fast axis of the second polarization controller may form an angle of 45 degrees.

The laser annealing apparatus may further include a second laser source, a second beam splitter, a third polarization controller, and a fourth polarization controller. The second laser source emits a second laser beam. The second beam splitter splits the second laser beam emitted from the second laser beam emission unit into a first slave beam in the first polarization state and a second slave beam in the second polarization state. The third polarization controller outputs a third slave beam having the third polarization state and corresponding to the first slave beam by changing the first polarization state of the first slave beam to the third polarization state. The fourth polarization controller outputs a fourth slave beam having the third polarization state and corresponding to the second slave beam by changing the second polarization state of the second slave beam to the third polarization state. The beam combiner combines the third master beam, the fourth master beam, the third slave beam, and the fourth slave beam with each other.

Each of the first beam splitter and the second beam splitter may include a polarization beam splitter.

Each of the first polarization controller, the second polarization controller, the third polarization controller, and the fourth polarization controller may include a half-wave plate. A fast axis of the first polarization controller and a fast axis of the second polarization controller may form an angle of 45 degrees, and a fast axis of the third polarization controller and a fast axis of the fourth polarization controller may form an angle of 45 degrees.

According to an exemplary embodiment of the present inventive concept, a method of manufacturing a display apparatus is provided. The method includes forming an amorphous silicon layer on a substrate, splitting a first laser beam emitted from a first laser source into a first master beam in a first polarization state and a second master beam in a second polarization state, changing the first polarization state of the first master beam to the second polarization state to output a third master beam having the second polarization state and corresponding to the first master beam having the second polarization state, combining the second master beam with the third master beam to output a merged laser beam, and irradiating the amorphous silicon layer with the merged laser beam to form a polysilicon layer.

The splitting of the first laser beam may be performed using a polarization beam splitter.

The changing of the first polarization state of the first master beam to the second polarization state may be performed using a half-wave plate.

The method may further include splitting a second laser beam emitted from a second laser source into a first slave beam in the first polarization state and a second slave beam in the second polarization state and changing the first polarization state of the first slave beam to the second polarization state to output a third slave beam having the second polarization state and corresponding to the first slave beam having the second polarization state. The combining of the second master beam with the third master beam comprises combining the second master beam with the third master beam, the second slave beam, and the third slave beam.

The splitting of the second laser beam may be performed using a polarization beam splitter.

The changing of the first polarization state of the first slave beam to the second polarization is performed using a half-wave plate.

According to an exemplary embodiment of the present inventive concept, a method of manufacturing a display apparatus is provided. The method includes forming an amorphous silicon layer on a substrate, splitting a first laser beam emitted from a first laser source into a first master beam in a first polarization state and a second master beam in a second polarization state, changing the first polarization state of the first master beam to a third polarization state to output a third master beam having the third polarization state and corresponding to the first master beam having the third polarization state, changing the second polarization state of the second master beam to the third polarization state to output a fourth master beam having the third polarization state and corresponding to the second master beam having the third polarization state, and combining the third master beam with the fourth master beam.

The splitting of the first laser beam may be performed using a polarization beam splitter.

The changing of the first polarization state of the first master beam to the third polarization state may be performed using a first polarization controller including a half-wave plate. The changing of the second polarization state of the second master beam to the third polarization state may be performed using a second polarization controller including a half-wave plate. A fast axis of the first polarization controller and a fast axis of the second polarization controller may form an angle of 45 degrees.

The method may further include splitting a second laser beam emitted from a second laser source into a first slave beam in the first polarization state and a second slave beam in the second polarization state, changing the first polarization state of the first slave beam to the third polarization state to output a third slave beam corresponding to the first slave beam having the third polarization state, and changing the second polarization state of the second slave beam to the third polarization state to output a fourth slave beam having the third polarization state and corresponding to the second slave beam having the third polarization state. The combining of the third master beam with the fourth master beam may include combining the third master beam with the fourth master beam, the third slave beam, and the fourth slave beam.

The splitting of the second laser beam may be performed using a polarization beam splitter.

The changing of the first polarization state of the first master beam to the third polarization state may be performed using a first polarization controller including a half-wave plate. The changing of the second polarization state of the second master beam to the third polarization state may be performed using a second polarization controller including a half-wave plate. The changing of the first polarization state of the first slave beam to the third polarization state may be performed using a third polarization controller comprising a half-wave plate. The changing of the second polarization state of the second slave beam to the third polarization state may be performed using a fourth polarization controller including a half-wave plate.

A fast axis of the first polarization controller and a fast axis of the second polarization controller may form an angle of 45 degrees, and a fast axis of the third polarization controller and a fast axis of the fourth polarization controller may form an angle of 45 degrees.

According to an exemplary embodiment of the present inventive concept, a laser annealing apparatus is provided. The laser annealing apparatus includes a first laser source, a first polarization beam splitter, a second polarization beam splitter, and a beam combiner. The first laser source emits a first laser beam. The first polarization beam splitter splits the first laser beam emitted from the first laser source into a first master beam in a first polarization state and a second master beam in a second polarization state perpendicular to the first polarization state. The first polarization controller changes the first polarization state of the first master beam to a third polarization state and outputs a third master beam corresponding to the first master beam having the third polarization state. The second polarization controller changes the second polarization state of the second master beam to the third polarization state and outputs a fourth master beam corresponding to the second master beam having the third polarization state. The beam combiner combines the third master beam and the fourth master beam with each other. A fast axis of the first polarization controller and a fast axis of the second polarization controller form an angle of 45 degrees.

BRIEF DESCRIPTION OF THE DRAWINGS

A more complete appreciation of the present invention and many of the attendant aspects thereof will be readily obtained as the same becomes better understood by reference to the following detailed description when considered in connection with the accompanying drawings, wherein.

DETAILED DESCRIPTIONS OF THE EMBODIMENTS

Exemplary embodiments of the present inventive concept will be described more fully with reference to the accompanying drawings. The present inventive concept may, however, be embodied in many different forms and should not be construed as being limited to the embodiments set forth herein. In the drawings, the sizes and the thicknesses of layers and regions may be exaggerated for clarity.

Like reference numerals may refer like elements throughout the written descriptions and drawings, and repeated descriptions thereof will be omitted.

As used herein, the term "and/or" includes any and all combinations of one or more of the associated listed items. As used herein, the singular forms "a", "an" and "the" are intended to include the plural forms as well, unless the context clearly indicates otherwise.

In the drawings, sizes and thickness of components may be exaggerated for clarity.

Figure 1:
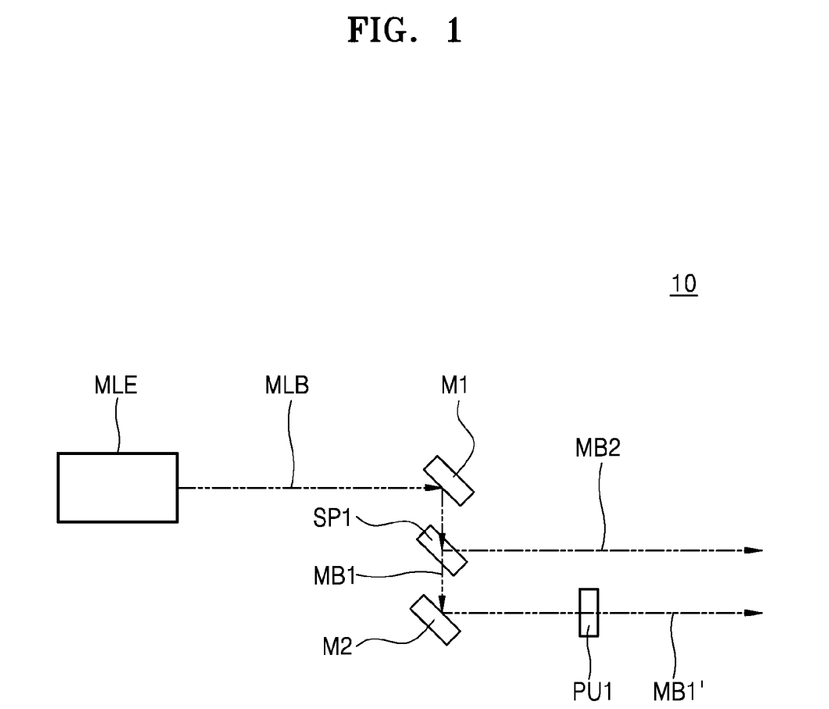
FIG. 1 is a diagram illustrating a portion of a laser beam annealing apparatus according to an exemplary embodiment of the present inventive concept.

FIG. 1 is a diagram illustrating a portion of a laser beam annealing apparatus 10 according to an exemplary embodiment of the present inventive concept. The laser beam annealing apparatus 10 may include a master laser beam emission unit MLE, a first split unit SP1, a first polarization unit PU1, and a merge unit.

The master laser beam emission unit MLE may emit a master laser beam MLB. The master laser beam MLB emitted from the master laser beam emission unit MLE may be, for example, a laser beam having a wavelength of substantially 308 nm. After a modulation process, etc., the master laser beam MLB may be used to irradiate amorphous silicon, and thus, the amorphous silicon may be crystallized into polysilicon.

The first split unit SP1 may split the master laser beam MLB emitted from the master laser beam emission unit MLE into a first master beam MB1 in a first polarization state and a second master beam MB2 in a second polarization state. In an exemplary embodiment of the present inventive concept, a first reflection part M1 may be further included in the laser beam annealing apparatus 10 and may be positioned on an optical path of the master laser beam MLB so that the master laser beam MLB emitted from the master laser beam emission unit MLE may be incident to the first split unit SP1 through the first reflection part M1, as illustrated in FIG. 1. For example, the first split unit SP1 may split the master laser beam MLB that is incident from the first reflection part M1, etc. into the first master beam MB1 and the second master beam MB2.

The first split unit SP1 may be, for example, a polarized beam split (PBS) unit. In this case, the PBS unit may include a reflective polarizer. The reflective polarizer may be a multilayer optical film. For example, a reflective polarizer that has been commercially distributed by 3M corporation may be used. The master laser beam MLB emitted from the master laser beam emission unit MLE may include a laser beam in an s-polarization state and a laser beam in a p-polarization state. The laser beam in the p-polarization state passes through the first split unit SP1 and becomes the first master beam MB1, and the laser beam in the s-polarization state is reflected from the reflective polarizer of the first split unit SP1 and becomes the second master beam MB2. The first master beam MB1 remains in the p-polarization state, and the second master beam MB2 remains in the s-polarization state.

The first polarization unit PU1 is positioned on an optical path of the first master beam MB1. The first polarization unit PU1 changes the first polarization state (e.g., the p-polarization state) of the first master beam MB1 to the second polarization state (e.g., the s-polarization state). For example, as described above, when the first master beam MB1 having the p-polarization state is incident to the first polarization unit PU1, a third master beam MB1', which corresponds to the first master beam MB1 whose polarization state has been changed to the s-polarization state through the first polarization unit PU1, is output from the first polarization unit PU1. To this end, the first polarization unit PU1 may include a half-wave plate. In an exemplary embodiment of the present inventive concept, a second reflection part M2 may further be included in the laser beam annealing apparatus 10 and may be positioned between the first split unit SP1 and the first polarization unit PU1, as illustrated in FIG. 1, and thus, the first master beam MB1 passing through the first split unit SP1 may be incident to the first polarization unit PU1.

Figure 2:
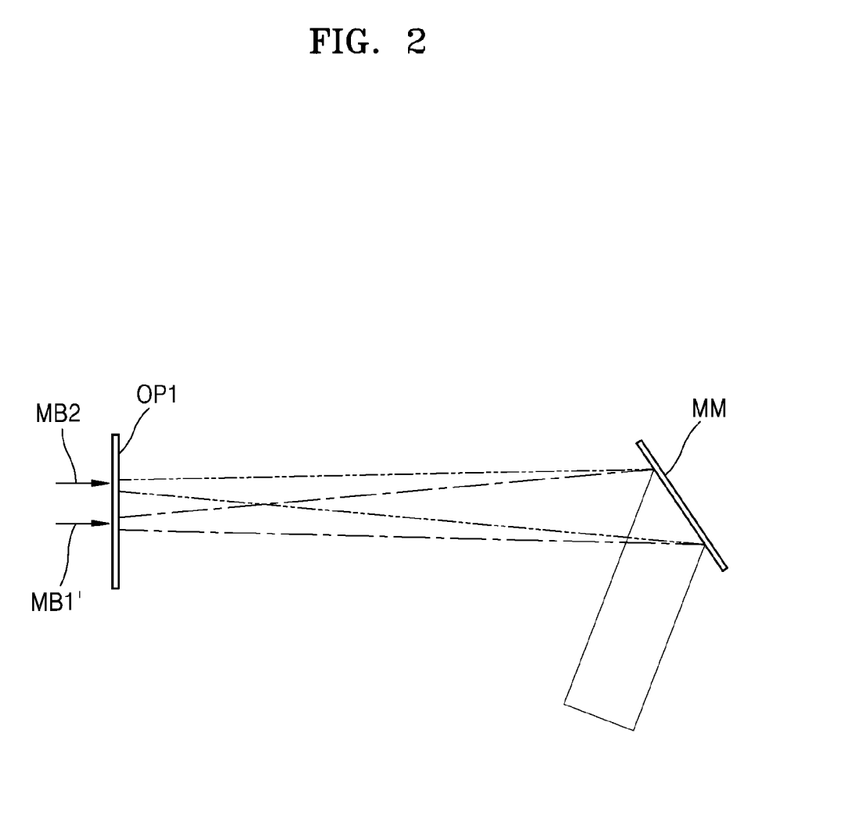
FIG. 2 is a diagram illustrating another portion of the laser beam annealing apparatus of FIG. 1 according to an exemplary embodiment of the present inventive concept.

FIG. 2 is a diagram illustrating another portion of the laser beam annealing apparatus 10 of FIG. 1 according to an exemplary embodiment of the present inventive concept. This portion illustrated in FIG. 2 may be understood as the merge unit of the laser beam annealing apparatus 10. As illustrated in FIG. 2, the second master beam MB2 and the third master beam MB1' that are both in the second polarization state are incident to the merge unit, are merged with each other through the merge unit, and thus, a laser beam generated by merging the master beams MB1' and MB2 is emitted from the merge unit. As illustrated in FIG. 2, the merge unit may include an optical element OP1 and a main reflection part MM. The master beams MB1' and MB2 that are both in the second polarization state are incident to the optical element OP1, and the main reflection part MM reflects and merges the incident master beams MB1' and MB2 as a single merged laser beam. The optical element OP1 may include a lens that expands the master beams MB1' and MB2 so that the master beams MB1' and MB2 are reflected from the same spot of the main reflection part MM. In addition, the optical element OP1 may include a homogenizer for homogenizing intensity distribution of the master beams MB1' and MB2. In an exemplary embodiment of the present inventive concept, the merged laser beam reflected from the main reflection part MM may pass through various optical elements and may be used to irradiate amorphous silicon, and thus, the amorphous silicon may be crystallized into polysilicon. However, a merge unit of the present inventive concept is not limited to the configuration and structure described with reference to FIG. 2. For example, the term "merging beams" may be understood to mean "combining beams", and the term "merge unit" may be understood to mean "an optical beam combiner". Thus, the merge unit of the present inventive concept may include any kind of optical elements to merge or combine beams.

In a laser beam annealing apparatus, amorphous silicon is crystallized into polysilicon at some locations of a substrate by irradiating the amorphous silicon with a laser beam. In this case, quality of the polysilicon may be increased by increasing the number of times the amorphous silicon is irradiated at a certain location. Thus, a time for crystallizing the amorphous silicon into polysilicon may be increased.

In the laser beam annealing apparatus (e.g., 10 of FIG. 1) according to an exemplary embodiment of the present inventive concept, the master laser beam MLB, in which the laser beam in the s-polarization state and the laser beam in the p-polarization state are mixed, is divided into the first master beam MB1 in the p-polarization state (e.g., the first polarization state) and the second master beam MB2 in the s-polarization state (e.g., the second polarization state). As described above, the first polarization unit PU1 receives the first master beam MB1 having the first polarization state, changes the first polarization state of the first master beam MB1 to the second polarization state, and outputs the third master beam MB1' having the second polarization state. In addition, the master beams MB1' and MB2 that are both in the second polarization state are merged with each other through the merger unit of FIG. 2. Accordingly, the merged laser beam having the second polarization state is used to irradiate an amorphous silicon layer.

When the amorphous silicon layer is repeatedly irradiated using the laser beams, grains formed in the amorphous silicon layer are arranged. When the laser beams have the same polarization state (e.g., the p-polarization or the s-polarization) as each other, efficiency of arranging grains of the amorphous silicon layer may be greater than that when the laser beams have different polarization states (e.g., the s-polarization state and the p-polarization state) from each other. Here, it is assumed that intensity of the laser beams having the same polarization state is substantially the same as intensity of the laser beams having different polarization states. Therefore, when the laser beam annealing apparatus (e.g., 10 of FIG. 1) that generates a laser beam having the same polarization state, according to an exemplary embodiment of the present inventive concept, is used, the number of times the amorphous silicon layer is irradiated by the laser beams to crystallize the amorphous silicon layer into a high-quality polysilicon layer is reduced compared to what occurs when a laser beam annealing apparatus that generates laser beams having the different polarization states from each other is used.

FIG. 1 illustrates that the first polarization unit PU1 is positioned after the second reflection part M2 on the optical path of the first master beam MB1, but the present inventive concept is not limited thereto. In an exemplary embodiment of the present inventive concept, after the first polarization state of the first master beam MB1 is changed to the second polarization state by passing through the first polarization unit PU1, the third master beam MB1', which corresponds to the first master beam MB1 whose polarization state has been changed to the second polarization state through the first polarization unit PU1, may be incident to the second reflection part M2. Although a case where the first polarization state is the p-polarization state and the second polarization state is the s-polarization state has been described, the present inventive concept is not limited thereto. For example, the first polarization state may be the s-polarization state, and the second polarization state may be the p-polarization state.

Figure 3:
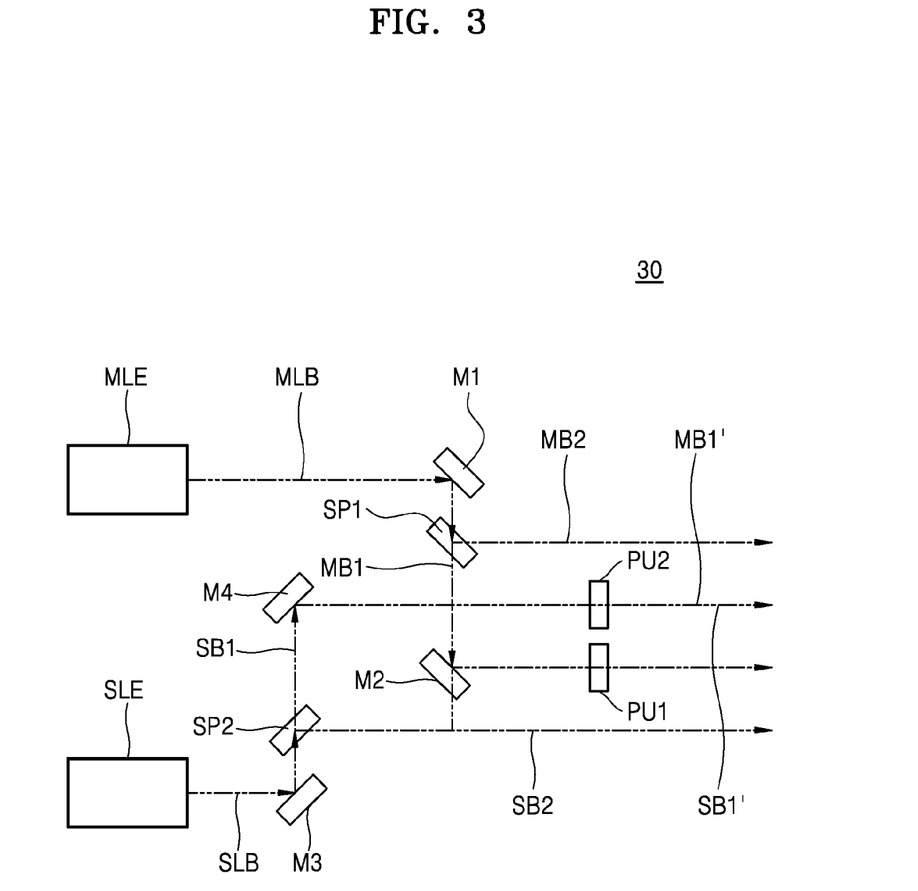
FIG. 3 is a diagram illustrating a portion of a laser beam annealing apparatus according to an exemplary embodiment of the present inventive concept.

FIG. 3 is a diagram illustrating a portion of a laser beam annealing apparatus 30 according to an exemplary embodiment of the present inventive concept. In addition to the components of the laser beam annealing apparatus 10 of FIG. 1, the laser beam annealing apparatus 30 of FIG. 3 may further include a slave beam emission unit SLE, a second split unit SP2, and a second polarization unit PU2.

The slave beam emission unit SLE may emit a slave laser beam SLB. The slave laser beam SLB emitted from the slave beam emission unit SLE may be, for example, a laser beam having a wavelength of substantially 308 nm. After a modulation process, etc., is performed, the slave laser beam SLB may be used to irradiate amorphous silicon and may crystallize the amorphous silicon into polysilicon.

The second split unit SP2 may split the slave laser beam SLB emitted from the slave beam emission unit SLE into the first slave beam SB1 in the first polarization state and the second slave beam SB2 in the second polarization state. In an exemplary embodiment of the present inventive concept, as illustrated in FIG. 3, a third reflection part M3 may further be included in the laser beam annealing apparatus 30 and may be positioned on an optical path of the slave laser beam SLB, such that the slave laser beam SLB emitted from the slave beam emission unit SLE may be incident to the second split unit SP2 through the third reflection part M3. The second split unit SP2 may split the slave laser beam SLB that is incident from the second reflection part M2, etc., into the first slave beam SB1 and the second slave beam SB2.

A structure and function of the second split unit SP2 of FIG. 3 may be substantially the same as the structure and function of the first split unit SP1 of the laser beam annealing apparatus 10 described with reference to FIG. 1. For example, the second split unit SP2 may be a polarization beam split unit including a reflective polarizer. The slave laser beam SLB emitted from the slave beam emission unit SLE may include a laser beam in the s-polarization state and a laser beam in the p-polarization state. The laser beam in the p-polarization state passes through the second split unit SP2 and becomes the first slave beam SB1, and the laser beam in the s-polarization state is reflected from the reflective polarizer of the second split unit SP2 and becomes the second slave beam SB2. The first slave beam SB1 remains in the p-polarization state, and the second slave beam SB2 remains in the s-polarization state.

The second polarization unit PU2 is positioned on an optical path of the first slave beam SB1. The second polarization unit PU2 changes the first polarization state (e.g., the p-polarization state) of the first slave beam SB1 to the second polarization state (e.g., the s-polarization state). For example, as described above, when the first slave beam SB1 having the p-polarization state is incident to the second polarization unit PU2, a third slave beam SB1', which corresponds to the first slave beam SB1 whose polarization state has been changed to the second polarization through the second polarization unit PU2, may be output from the second polarization unit PU2. To this end, the second polarization unit PU2 may include a half-wave plate. In an exemplary embodiment of the present inventive concept, a fourth reflection part M4 may further be included in the laser beam annealing apparatus 30 and may be positioned between the second split unit SP2 and the second polarization unit PU2, as illustrated in FIG. 3, and thus, the first slave beam SB1 passing through the second split unit SP2 may be incident to the second polarization unit PU2.

A merge unit having substantially the same structure as the merge unit of FIG. 2 merges the third master beam MB1', the second master beam MB2, the third slave beam SB1', and the second slave beam SB2 having the same polarization state (e.g., the second polarization state). The merged laser beam having, e.g., the second polarization state is used to irradiate amorphous silicon, and thus, the amorphous silicon is crystallized into polysilicon.

In the laser beam annealing apparatus 30 according to an exemplary embodiment of the present inventive concept, each of the master laser beam MLB and the slave laser beam SLB includes laser beams in the s-polarization state and the p-polarization state in a mixed manner, and the laser beams MB1 and SB1 in the p-polarization state (e.g., the first polarization state) are divided from the laser beams MB2 and SB2 in the s-polarization state (e.g., the second polarization state) through the laser beam annealing apparatus 30 according to an exemplary embodiment of the present inventive concept. After the first polarization state of the laser beams MB1 and SB1 is changed to the second polarization state, the laser beams MB1', SB1, MB2', and SB2 having the same polarization state (e.g., the second polarization state) are merged with each other. Accordingly, the amorphous silicon layer is irradiated with the merged laser beam in the second polarization state. When the laser beam annealing apparatus 30 according to an exemplary embodiment of the present inventive concept is used, the number of times an amorphous silicon layer is irradiated by the laser beams to crystallize the amorphous silicon layer into a high-quality polysilicon layer is reduced compared to what occurs when a laser beam annealing apparatus that generates laser beams having the different polarization states from each other is used.

In addition, the laser beam annealing apparatus 30 of FIG. 3 uses the master laser beam MLB and the slave laser beam SLB, which are respectively emitted from the master laser beam emission unit MLE and the slave laser emission unit SLE, and a laser beam that is used to finally irradiate the amorphous silicon is formed by using the master laser beam MLB and the slave laser beam SLB. In this case, the master laser beam MLB may have different phase/strength distributions from those of the slave laser beam SLB, and thus, a dispersion property of the laser beam that is finally irradiated onto the amorphous silicon may be uniform.

In FIG. 3, the first polarization unit PU1 is positioned after the second reflection part M2 on the optical path of the first master laser beam MB1, and the second polarization unit PU2 is positioned after the fourth reflection part M4 on the optical path of the first slave beam SB1, but the present inventive concept is not limited thereto. In an exemplary embodiment of the present inventive concept, after the first polarization state of the first master beam MB1 is changed to the second polarization state by passing through the first polarization unit PU1, a third master beam MB1', which corresponds to the first master beam MB1 whose polarization state has been changed to the second polarization state through the first polarization unit PU1 may be incident to the second reflection part M2. In addition, after the first polarization state of the first slave beam SB1 is changed to the second polarization state by passing through the second polarization unit PU2, a third slave beam SB1', which corresponds to the first slave beam SB1 whose polarization state has been changed to the second polarization state through the second polarization unit PU2, may be incident to the fourth reflection part M4. Although a case where the first polarization state is the p-polarization state and the second polarization state is the s-polarization state has been described, the present inventive concept is not limited thereto. For example, the first polarization state may be the s-polarization state, and the second polarization state may be the p-polarization state.

Figure 4:
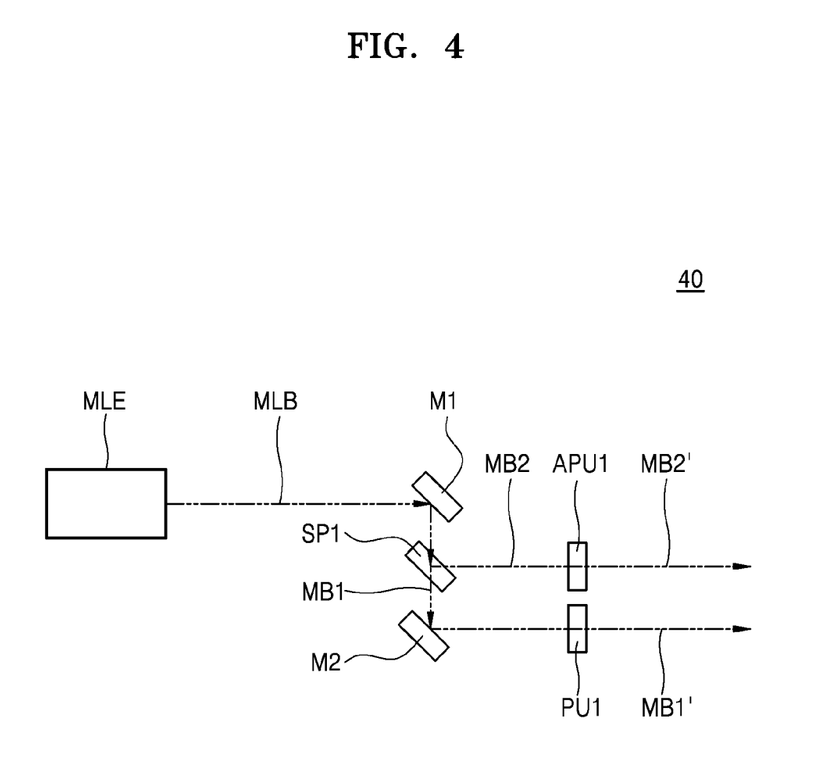
FIG. 4 is a diagram illustrating a portion of a laser beam annealing apparatus according to an exemplary embodiment of the present inventive concept.

FIG. 4 is a diagram illustrating a portion of a laser beam annealing apparatus 40 according to an exemplary embodiment of the present inventive concept. Referring to FIG. 4, the laser beam annealing apparatus 40 includes the master laser beam emission unit MLE, the first split unit SP1, the first polarization unit PU1, a first additional polarization unit APU1, and a merge unit.

Referring to FIG. 4, the master laser beam MLB is divided into the first master beam MB1 in the first polarization state and the second master beam MB2 in the second polarization state through the first split unit SP1, the first master beam MB1 passes through the first polarization unit PU1, and the second master beam MB2 passes through the first additional polarization unit APU1. In this case, the first polarization unit PU1 changes the first polarization state of the first master beam MB1 to a third polarization state and outputs a third master beam MB1', which corresponds to the first master beam MB1 whose polarization state has been changed to the third polarization state through the first polarization unit PU1, and the first additional polarization unit APU1 changes the second polarization state of the second master beam MB2 to the third polarization state and outputs a fourth master beam MB2', which corresponds to the second master beam MB2 whose polarization state has been changed to the third polarization state through the first additional polarization unit APU1. The merge unit merges the third master beam MB1' and the fourth master beam MB2' having the same polarization state (e.g., the third polarization state) with each other. The laser beam annealing apparatus 40 of FIG. 4 may have substantially the same configurations as those of the laser beam annealing apparatus 10 described above with respect to FIG. 1 except that the laser beam annealing apparatus 40 of FIG. 4 further includes the first additional polarization unit APU1. Thus, duplicate descriptions will be omitted.

Each of the first polarization unit PU1 and the first additional polarization unit APU1 may include a half-wave plate. Hereinafter, the first polarization unit PU1 and the first additional polarization unit APU1 will be described.

Figure 5:
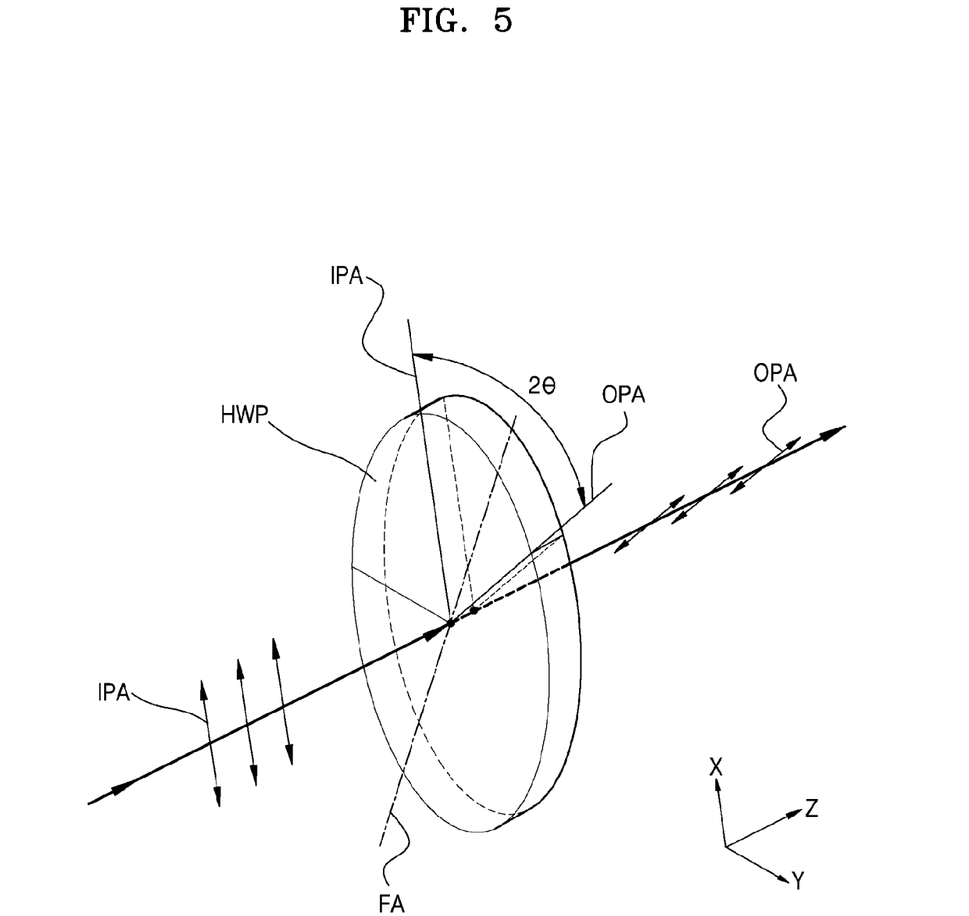
FIG. 5 is a diagram illustrating a phase change when a laser beam of FIG. 4 passes through an element according to an exemplary embodiment of the present inventive concept.

FIG. 5 is a diagram illustrating a phase change when a laser beam (e.g., the master beam MB1 or MB2) of FIG. 4 passes through an element. Here, the element may be understood as a half-wave plate HWP included in the first polarization unit PU1 or the first additional polarization unit APU1. The half-wave plate HWP may have a fast axis FA and a slow axis, and when the fast axis FA of the half-wave plate HWP and an input polarization axis IPA of the laser beam forms an angle of θ, an output polarization axis OPA of the laser beam passing through the half-wave plate HWP may form an angle of 2θ with respect to the input polarization axis IPA. For example, when input light is in the p-polarization state and θ is 45 degrees and, a polarization state of the output light passing through the half-wave plate HWP may be in the s-polarization state whose polarization axis is rotated by 90 degrees from the polarization axis of the input light.

In the laser beam annealing apparatus 40 of FIG. 4, each of the first polarization unit PU1 and the first additional polarization unit APU1 includes the half-wave plate, the fast axis of the first polarization unit PU1 may form an angle of 45 degrees with respect to the fast axis of the first additional polarization unit APU1. Accordingly, when the master laser beam MLB is divided into the first master beam MB1 in the p-polarization state (e.g., the first polarization state) and the second master beam MB2 in the s-polarization state (e.g., the second polarization state) through the first split unit SP1, and when the angle formed between a polarization axis of the first master beam MB1 and the fast axis of the half-wave plate of the first polarization unit PU1 is equal to θ, an angle formed between the polarization axis of the second master beam MB2 and the polarization axis of the first master beam MB1 is 90 degrees, and thus, an angle formed between the polarization axis of the second master beam MB2 and the fast axis of the first additional polarization unit APU1 may be "θ-45 degrees".

Thus, a polarization axis of the master beam MB1' (e.g., a laser beam output from the first polarization unit PU1) rotates by an angle of substantially 2θ with respect to the polarization axis of the first master beam MB1 (e.g., a laser beam input to the first polarization unit PU1), and a polarization axis of the second master beam MB2' (e.g., a laser beam output from the first additional polarization unit APU1) rotates by an angle of substantially "2θ-90 degrees" respect to the second master beam MB2 (e.g., a laser beam input to the first additional polarization unit APU1). Since the angle formed between the polarization axis of the first master beam MB1 before passing through the first polarization unit PU1 and the polarization axis of the second master beam MB2 before passing through the first additional polarization unit APU1 is 90 degrees, the polarization axis of the third master beam MB1' is the same as the polarization axis of the fourth master beam MB2', and thus, the third master beam MB1' and the fourth master beam MB2' may be understood as having the same polarization state (e.g., the third polarization state). For example, when θ is equal to 45 degrees, the third polarization state may be understood as the second polarization state (e.g., the s-polarization state). For example, when θ is equal to 90 degrees, the third polarization state may be understood as the first polarization state (e.g., the p-polarization state). For example, when θ is neither 45 nor 90 degrees, the third polarization state may be neither the p-polarization state nor the s-polarization state.

In the laser beam annealing apparatus 40 according to an exemplary embodiment of the present inventive concept, the master laser beam MLB includes laser beams in the s-polarization state and the p-polarization state in a mixed manner, and the first master beam MB1 in the p-polarization state (e.g., the first polarization state) is divided from the second master beam MB2 in the s-polarization state (e.g., the second polarization state) through the laser beam annealing apparatus 40. After the polarization state of each of the first master beam MB1 and the second master beam MB2 is changed to the third polarization state, the third master beam MB1' and the fourth master beam MB2' in the third polarization state are merged with each other through the merged unit. Accordingly, the laser beams that are in the third polarization state are used to irradiate the amorphous silicon layer.

When the amorphous silicon layer is repeatedly irradiated by the laser beams, grains formed in the amorphous silicon layer are arranged. When the laser beams have the same polarization state (e.g., the p-polarization or the s-polarization) as each other, efficiency of arranging grains of the amorphous silicon layer may be greater than that when the laser beams have different polarization states (e.g., the s-polarization state and the p-polarization state) from each other is used. Here, it is assumed that intensity of the laser beams having the same polarization state is substantially the same as intensity of the laser beams having different polarization states. Therefore, when the laser beam annealing apparatus (e.g., 30 of FIG. 3 or 40 of FIG. 4) that generates a laser beam having the same polarization state, according to an exemplary embodiment of the present inventive concept, is used, the number of times amorphous silicon layer is irradiated by the laser beams to crystallize the amorphous silicon layer into a high-quality polysilicon layer is reduced compared to what occurs when a laser beam annealing apparatus that generates laser beams having the different polarization states from each other is used.

FIG. 4 illustrates that the first polarization unit PU1 is positioned after the second reflection part M2 on the optical path of the first master beam MB1, but the present inventive concept is not limited thereto. In an exemplary embodiment of the present inventive concept, after the first polarization state of the first master beam MB1 changes to the third polarization state by passing through the first polarization unit PU1, the third master beam MB1' in the third polarization state may be incident to the second reflection part M2. Although a case where the first polarization state is the p-polarization state and the second polarization state is the s-polarization state has been described, the present inventive concept is not limited thereto. For example, the first polarization state may be the s-polarization state and the second polarization state may be the p-polarization state.

Figure 6:
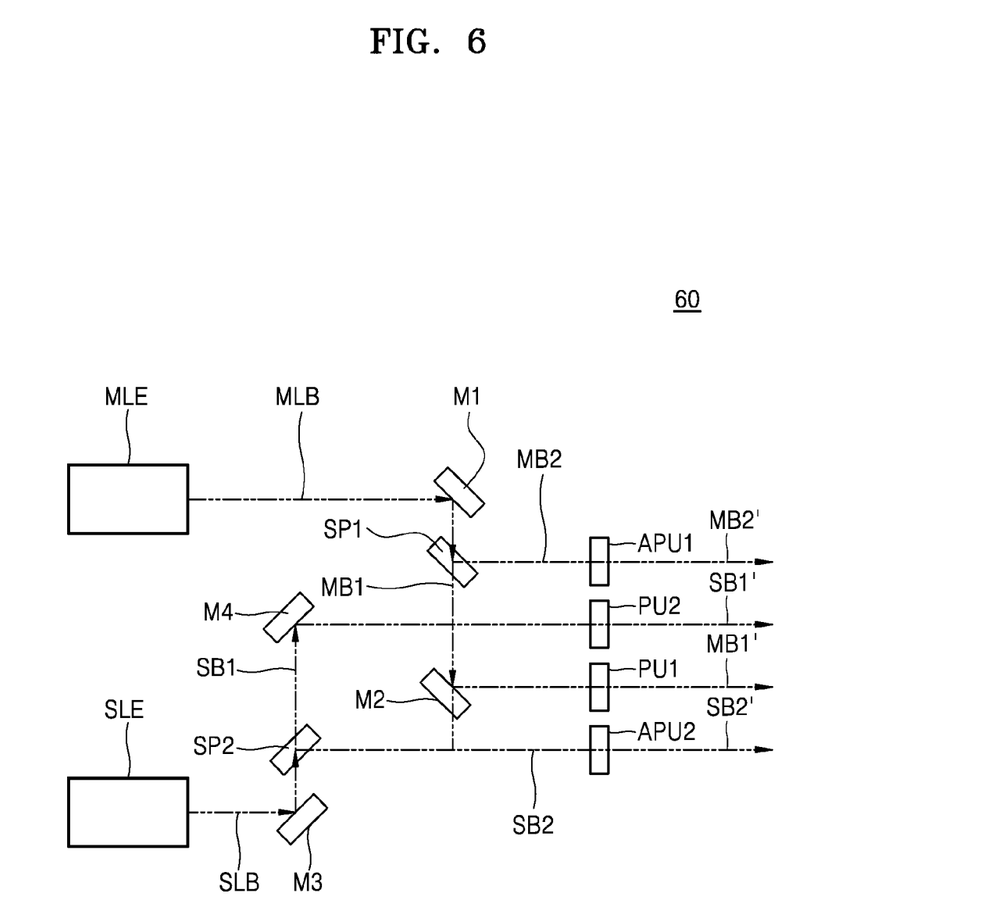
FIG. 6 is a diagram illustrating a portion of a laser beam annealing apparatus according to an exemplary embodiment of the present inventive concept.

FIG. 6 is a diagram illustrating a portion of a laser beam annealing apparatus 60 according to an exemplary embodiment of the present inventive concept. In addition to the laser beam annealing apparatus 40 of FIG. 4, the laser beam annealing apparatus 60 of FIG. 6 may further include a slave beam emission unit SLE, a second split unit SP2, a second polarization unit PU2, and a second additional polarization unit APU2.

The slave beam emission unit SLE may emit a slave laser beam SLB. The second split unit SP2 may split the slave laser beam SLB emitted from the slave beam emission unit SLE into a first slave beam SB1 in the first polarization state and a second slave beam SB2 in the second polarization state. For example, the first polarization state may be the p-polarization state, and the second polarization state may be the s-polarization state. Descriptions of the slave beam emission unit SLE or the second split unit SP2 of the laser beam annealing apparatus 60 of FIG. 6 are substantially the same as the descriptions of the slave beam emission unit SLE or the second split unit SP2 of the laser beam annealing apparatus 30 of FIG. 3, and thus, will be omitted.

The second polarization unit PU2 is positioned on an optical path of the first slave beam SB1. The second polarization unit PU2 changes the first polarization state of the first slave beam SB1 to the third polarization state. Descriptions of the second polarization unit PU2 or the second additional polarization unit APU2 of the laser beam annealing apparatus 60 of FIG. 6 are substantially the same as the descriptions of the first polarization unit PU1 or the first additional polarization unit APU1 of the laser beam annealing apparatus 40 of FIG. 4, and thus, will be omitted.

In the laser beam annealing apparatus 60 according to an exemplary embodiment of the present inventive concept, the third master beam MB1', the fourth master beam MB2', the third slave beam SB1', and the fourth slave beam SB2' may all have the third polarization state. The merge unit merges the third master beam MB1', the fourth master beam MB2', the third slave beam SB1', and the fourth slave beam SB2' that are in the third polarization state. The merged laser beam having the third polarization state is used to irradiate amorphous silicon, and thus, the amorphous silicon is crystallized into polysilicon.

In the laser beam annealing apparatus 60 according to an exemplary embodiment of the present inventive concept, the merged laser beam in the third polarization state is used to irradiate an amorphous silicon layer. Accordingly, when the laser beam annealing apparatus (e.g., 60 of FIG. 6) that generates a laser beam having the same polarization state, according to an exemplary embodiment of the present inventive concept, is used, the number of times amorphous silicon layer is irradiated by the laser beam to crystallize the amorphous silicon layer into a high-quality polysilicon layer is reduced compared to what occurs when a laser beam annealing apparatus that generates laser beams having the different polarization states from each other is used.

In addition, the laser beam annealing apparatus 60 of FIG. 6 according to an exemplary embodiment of the present inventive concept uses the master laser beam MLB and the slave laser beam SLB, which are respectively emitted from the master laser beam emission unit MLE and the slave beam emission unit SLE, and a laser beam that is used to finally irradiate amorphous silicon is formed by using the master laser beam MLB and the slave laser beam SLB. In this case, the master laser beam MLB may have different phase/strength distributions from those of the slave laser beam SLB, and thus, a property distribution of the laser beam that is finally irradiated onto the amorphous silicon may be uniform.

FIG. 6 illustrates that the first polarization unit PU1 is positioned after the second reflection part M2 on the optical path of the first master beam MB1, and the second polarization unit PU2 is positioned after the fourth reflection part M4 on the optical path of the first slave beam SB1, but the present inventive concept is not limited thereto. In an exemplary embodiment of the present inventive concept, after the first polarization state of the first master beam MB1 is changed to the third polarization state by passing through the first polarization unit PU1, the third master beam MB1' in the third polarization state may be incident to the second reflection part M2. In addition, after the first polarization state of the first slave beam SB1 is changed to the third polarization state by passing through the second polarization unit PU2, the third slave beam SB1' in the third polarization state may be incident to the fourth reflection part M4. Although a case where the first polarization state is the p-polarization state and the second polarization state is the s-polarization state has been described, the present inventive concept is not limited thereto. For example, the first polarization state may be the s-polarization stat, and the second polarization state may be the p-polarization state.

Figure 7:
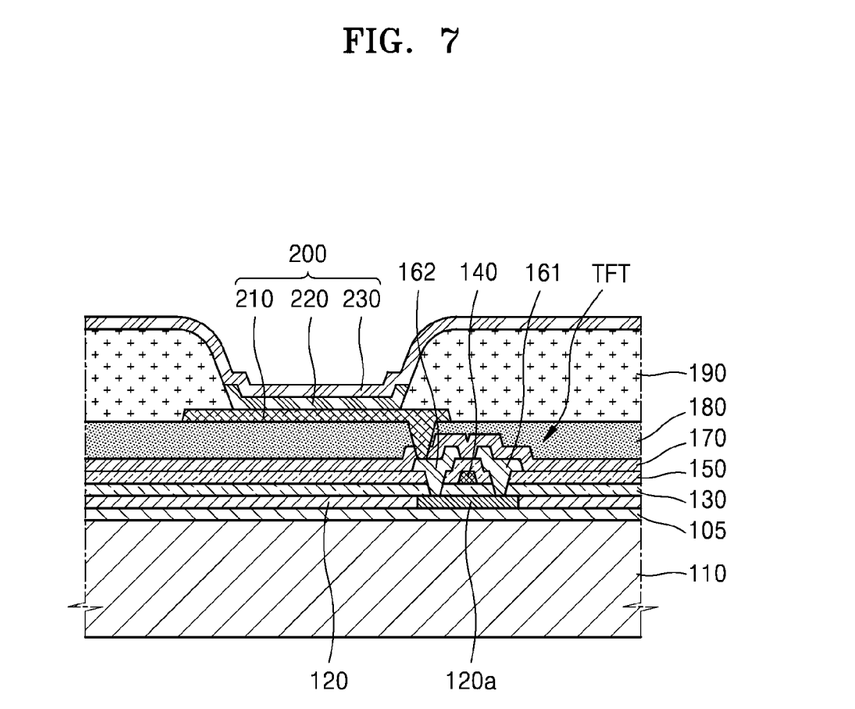
FIG. 7 is a cross-sectional view illustrating a portion of a display apparatus manufactured using a method of manufacturing a display apparatus, according to an exemplary embodiment of the present inventive concept.

The laser beam annealing apparatus (e.g., 10 of FIG. 1, 30 of FIG. 3, 40 of FIG. 4, or 60 of FIG. 6) according to an exemplary embodiment of the present inventive concept may be used to manufacture a display apparatus, and a method of manufacturing the display apparatus is included in the scope of the present inventive concept. FIG. 7 is a cross-sectional view illustrating a portion of a display apparatus manufactured using a method of manufacturing a display apparatus, according to an exemplary embodiment of the present inventive concept. The display apparatus may be an organic light emitting display apparatus.

A common layer such as a buffer layer 105, a gate insulating layer 130, and an interlayer insulating layer 150 may be formed on an entire substrate 110, and a semiconductor layer including an amorphous silicon area 120 and a polysilicon area 120*a* may be formed on the entire substrate 110. In addition, a thin film transistor (TFT) including the polysilicon area 120*a* of the semiconductor layer as an active layer, a gate electrode 140, a source electrode 161, and a drain electrode 162 may be formed on the substrate 110. In an exemplary embodiment of the present inventive concept, the amorphous silicon area 120 might not be formed, and only the polysilicon area 120*a* may be formed. The polysilicon area 120*a* may be formed by crystallizing a whole amorphous silicon layer. In an exemplary embodiment of the present inventive concept, the polysilicon area 120*a* may be formed by crystallizing a part of the amorphous silicon layer and removing the remaining part of the amorphous silicon layer.

A protection layer 170 and a planarization layer 180 may further be formed on the entire substrate 110. The protection layer 170 covers the TFT. The planarization layer 180 is disposed above the protection layer 170, and the upper surface of the planarization layer 180 is substantially flat. An organic light-emitting device 200 may be disposed above the planarization layer 180. The organic light-emitting device 200 may include a patterned pixel electrode 210, an opposite electrode 230, and an intermediate layer 220 which is disposed between the pixel electrode 210 and the opposite electrode 230. The opposite electrode 230 may be formed to correspond to substantially the entire substrate 110. The organic light-emitting device 200 may further include an emission layer, and have a multilayer structure. In an exemplary embodiment of the present inventive concept, some portions of the intermediate layer 220 may be a common layer formed to correspond to substantially the entire substrate 110, and the other portions of the intermediate layer 220 may be a patterned layer that corresponds to the pixel electrode 210. The pixel electrode 210 may be electrically connected to the TFT via a via hole. A pixel-defining layer 190 covering edges of the pixel electrode 210 and having an opening defining each pixel area may be formed on the planarization layer 180 such that the pixel-defining layer 190 may correspond to substantially the entire substrate 110.

In this case, the polysilicon area 120*a* may be formed by using the laser beam annealing apparatus (e.g., 10 of FIG. 1, 30 of FIG. 3, 40 of FIG. 4, or 60 of FIG. 6) according to an exemplary embodiment of the present inventive concept.

According to an exemplary embodiment of the present inventive concept, a method of manufacturing a display apparatus includes forming an amorphous silicon layer on the substrate 110, changing at least a portion of the amorphous silicon layer into a polysilicon layer by irradiating the at least a portion of the amorphous silicon layer with a laser beam emitted through the laser beam annealing apparatus (e.g., 10 of FIG. 1, 30 of FIG. 3, 40 of FIG. 4, or 60 of FIG. 6) according to an exemplary embodiment of the present inventive concept, and forming a display apparatus. The method is also included in the scope of the present inventive concept. When the method of manufacturing a display apparatus according to an exemplary embodiment of the present inventive concept is used, the number of times the amorphous silicon layer is irradiated by the laser beam during a laser beam annealing process may be reduced, a manufacturing time of the display apparatus may be reduced, and thus, a manufacturing yield thereof may be increased.

The present inventive concept is not limited to the organic light-emitting display apparatus. For example, the display apparatus may be a liquid crystal display (LCD) apparatus, which has the TFT including a polysilicon layer as an active layer.

For example, according to the method of manufacturing the display apparatus, the amorphous silicon layer is formed on the substrate, and a master laser beam emitted from a master laser beam emission unit is split into a first master beam in a first polarization state and a second master beam in a second polarization state. In addition, the first polarization state of the first master beam is changed to the second polarization state, and the first master beam whose polarization state has been changed to the second polarization state and the second master beam having the second polarization state are merged with each other. In addition, the amorphous silicon layer is irradiated with the merged laser beam having the second polarization state. Thus, the amorphous silicon layer may be changed into a polysilicon layer, and thus, a high-quality display apparatus may be manufactured by forming a TFT including the polysilicon layer and forming a display element (e.g., a pixel) that is electrically connected to the TFT.

A polarization beam split unit may be used to split the master laser beam, and a half-wave plate may be used to change the polarization state of the first master beam to the second polarization state.

A slave laser beam emitted from a slave laser beam emission unit is split into a first slave beam in the first polarization state and a second slave beam in the second polarization state. The first polarization state of the first slave beam is changed to the second polarization state. The first slave beam whose polarization state has been changed to the second polarization state and the second slave beam having the second polarization state are merged with the first master beam whose polarization state has been changed to the second polarization state and the second master beam having the second polarization state, and thus, the amorphous silicon layer may be irradiated with the merged laser beam having the second polarization state.

In this case, the polarization beam split unit may be used to split the slave laser beam, and the half-wave plate may be used to change the first polarization state of the first slave beam to the second polarization state. For example, a merge unit of FIG. 2 may be used to merge the laser beams (e.g., the first master beam having the second polarization state, the second master beam having the second polarization state, the first slave beam having the second polarization state, and/or the second slave beam having the second polarization state) with each other.

According to a method of manufacturing a display apparatus according to an exemplary embodiment of the present inventive concept, an amorphous silicon layer is formed on a substrate. A master laser beam emitted from a master laser beam emission unit is split into a first master beam in a first polarization state and a second master beam in a second polarization state. In addition, the first polarization state of the first master beam is changed to a third polarization state, and the second polarization state of the second master beam is changed to the third polarization state. In addition, the first and second master beams, the polarization state of each of which has been changed to the third polarization state, are merged, and the amorphous silicon layer is irradiated with the merged beam having the third polarization state. Thus, the amorphous silicon layer may be changed into a polysilicon layer. A high-quality display apparatus may be manufactured by forming a TFT including the polysilicon layer and forming a display element (e.g., a pixel) that is electrically connected to the TFT.

In this case, a polarization beam split unit may be used to split the master laser beam. A first polarization unit including a half-wave plate may be used to change the polarization state of the first master beam to the third polarization state, and a first additional polarization unit including a half-wave plate may be used to change the polarization state of the second master beam to the third polarization state. In this case, an angle formed between a fast axis of the first polarization unit and a fast axis of the first additional polarization unit may be 45 degrees as described with reference to FIGS. 4 and 5.

A slave laser beam emitted from a slave laser beam emission unit is split into a first slave beam in the first polarization state and a second slave beam in the second polarization state. The first polarization state of the first slave beam is changed to the third polarization state, and the second polarization state of the second slave beam is changed to the third polarization state. The first slave beam whose polarization state has been changed to the third polarization state and the second slave beam having the third polarization state are merged with the first master beam whose polarization state has been changed to the third polarization state and the second master beam having the third polarization state, and thus, the amorphous silicon layer may be irradiated with the merged laser beam having the third polarization state.

In this case, the polarization beam split unit may be used to split the slave laser beam, and a first polarization unit including a half-wave plate may be used to change the first polarization state of the first master beam to the third polarization state, and a first additional polarization unit including a half-wave plate may be used to change the second polarization state of the second master beam to the third polarization state. In addition, a second polarization unit including a half-wave plate may be used to change the first polarization state of the first slave beam to the third polarization state, and a second additional polarization unit including a half-wave plate may be used to change the second polarization state of the second slave beam to the third polarization state. In this case, an angle formed between a fast axis of the first polarization unit and a fast axis of the first additional polarization unit may be 45 degrees, and an angle formed between a fast axis of the second polarization unit and a fast axis of the second additional polarization unit may be 45 degrees as described with reference to FIGS. 5 and 6.

According to an exemplary embodiment of the present inventive concept, a laser beam annealing apparatus of crystallizing amorphous silicon into high-quality polysilicon and a method of manufacturing a display apparatus using the laser beam annealing apparatus have been described. However, the scope of the present inventive concept is not limited thereto.

It should be understood that exemplary embodiments of the present inventive concept described herein should be considered in a descriptive sense only and not for purposes of limitation.

While exemplary embodiments of the present inventive concept have been particularly shown and described, it will be understood that various changes in form and details may be made therein without departing from the spirit and scope.

What is claimed is:

1. A method of manufacturing a display apparatus, the method comprising:
    forming an amorphous silicon layer on a substrate;
    splitting a first laser beam emitted from a first laser source into a first master beam in a first polarization state and a second master beam in a second polarization state;
    changing the first polarization state of the first master beam to the second polarization state to output a third master beam having the second polarization state and corresponding to the first master beam having the second polarization state;
    combining the second master beam with the third master beam to output a merged laser beam, wherein the second master beam and the third master beam have a same polarization state as each other; and
    irradiating the amorphous silicon layer with the merged laser beam to form a polysilicon layer.

2. The method of claim 1, wherein the splitting of the first laser beam is performed using a polarization beam splitter.

3. The method of claim 1, wherein the changing of the first polarization state of the first master beam to the second polarization state is performed using a half-wave plate.

4. The method of claim 1, further comprising:
splitting a second laser beam emitted from a second laser source into a first slave beam in the first polarization state and a second slave beam in the second polarization state; and
changing the first polarization state of the first slave beam to the second polarization state to output a third slave beam having the second polarization state and corresponding to the first slave beam having the second polarization state,
wherein the combining of the second master beam with the third master beam comprises combining the second master beam with the third master beam, the second slave beam, and the third slave beam.

5. The method of claim 4, wherein, the splitting of the second laser beam is performed using a polarization beam splitter.

6. The method of claim 4, wherein the changing of the first polarization state of the first slave beam to the second polarization is performed using a half-wave plate.

7. A method of manufacturing a display apparatus, the method comprising:
forming an amorphous silicon layer on a substrate;
splitting a first laser beam emitted from a first laser source into a first master beam in a first polarization state and a second master beam in a second polarization state;
changing the first polarization state of the first master beam to a third polarization state to output a third master beam having the third polarization state and corresponding to the first master beam having the third polarization state;
changing the second polarization state of the second master beam to the third polarization state to output a fourth master beam having the third polarization state and corresponding to the second master beam having the third polarization state; and
combining the third master beam with the fourth master beam, wherein the third master beam and the fourth master beam have a same polarization state as each other.

8. The method of claim 7, wherein the splitting of the first laser beam is performed using a polarization beam splitter.

9. The method of claim 7, wherein the changing of the first polarization state of the first master beam to the third polarization state is performed using a first polarization controller comprising a half-wave plate, and
wherein the changing of the second polarization state of the second master beam to the third polarization state is performed using a second polarization controller comprising a half-wave plate, and
wherein a fast axis of the first polarization controller and a fast axis of the second polarization controller form an angle of 45 degrees.

10. The method of claim 7, further comprising:
splitting a second laser beam emitted from a second laser source into a first slave beam in the first polarization state and a second slave beam in the second polarization state;
changing the first polarization state of the first slave beam to the third polarization state to output a third slave beam corresponding to the first slave beam having the third polarization state; and
changing the second polarization state of the second slave beam to the third polarization state to output a fourth slave beam having the third polarization state and corresponding to the second slave beam having the third polarization state,
wherein the combining of the third master beam with the fourth master beam comprises combining the third master beam with the fourth master beam, the third slave beam, and the fourth slave beam.

11. The method of claim 10, wherein the splitting of the second laser beam is performed using a polarization beam splitter.

12. The method of claim 10, wherein the changing of the first polarization state of the first master beam to the third polarization state is performed using a first polarization controller comprising a half-wave plate,
wherein the changing of the second polarization state of the second master beam to the third polarization state is performed using a second polarization controller comprising a half-wave plate,
wherein the changing of the first polarization state of the first slave beam to the third polarization state is performed using a third polarization controller comprising a half-wave plate,
wherein the changing of the second polarization state of the second slave beam to the third polarization state is performed using a fourth polarization controller comprising a half-wave plate,
wherein a fast axis of the first polarization controller and a fast axis of the second polarization controller form an angle of 45 degrees, and
wherein a fast polarization axis of the third polarization controller and a fast polarization axis of the fourth polarization controller form an angle of 45 degrees.

* * * * *